United States Patent
Chuang et al.

(10) Patent No.: US 7,021,941 B1
(45) Date of Patent: Apr. 4, 2006

(54) FLEXIBLE LAND GRID ARRAY CONNECTOR

(75) Inventors: Ping Chuang, Taoyuan Hsien (TW); Li-Sen Chen, Taoyuan Hsien (TW); Chien-Yu Hsu, Taoyuan Hsien (TW)

(73) Assignee: Speed Tech Corp., Taoyuan Hsien (TW)

( * ) Notice: Subject to any disclaimer, the term of this patent is extended or adjusted under 35 U.S.C. 154(b) by 0 days.

(21) Appl. No.: 10/969,369

(22) Filed: Oct. 19, 2004

(51) Int. Cl.
*H01R 12/00* (2006.01)

(52) U.S. Cl. .................................................. 439/66

(58) Field of Classification Search ............... 439/66, 439/71, 81, 91; 174/262, 265, 266
See application file for complete search history.

(56) References Cited

U.S. PATENT DOCUMENTS

| | | | |
|---|---|---|---|
| 5,386,627 A * | 2/1995 | Booth et al. .................. 29/852 |
| 6,204,065 B1 * | 3/2001 | Ochiai ......................... 436/66 |
| 6,239,386 B1 * | 5/2001 | DiStefano et al. ........... 174/262 |
| 6,814,584 B1 * | 11/2004 | Zaderej ...................... 439/66 |

* cited by examiner

*Primary Examiner*—Alexander Gilman
(74) *Attorney, Agent, or Firm*—Pro-Techtor Int'l Services

(57) ABSTRACT

An LGA connector is used to interconnect an LGA package and a printed circuit board. The LGA connector includes an elastomeric body with a plurality of through-holes. Metal films are formed on inner walls of through-holes and splay out around the mouths of their upper and lower openings. The metal films are formed by vacuum metallization, sputtering, chemical plating, electrical plating or PVD. The through-holes have a funnel-like shape to absorb external stresses and redirect the stress to shrink the through-hole diameters. Moreover, the metal films' elastic deformation is larger than conventional metal conductive fillers so as to improve reliability.

4 Claims, 2 Drawing Sheets

FLEXIBLE LAND GRID ARRAY CONNECTOR

BACKGROUND

1. Field of Invention

The present invention relates to a flexible land grid array connector. More particularly, the present invention relates to a flexible connector between a land grid array connector and a printed circuit board.

2. Description of Related Art

Integrated circuits are typically housed within a package, which is designed to protect the circuit from damage, provide adequate heat dissipation during operation, and provide electrical connection between the integrated circuits and the leads of a printed circuit board. Several conventional package types, such as land grid array (LGA), pin grid array (PGA), ball grid array (BGA) and column grid array (CGA), are designed to provide the above functions.

The current trend for connector design in the computer field is to provide both high-density and high-reliability connections between various major circuit devices of a computer. High reliability for such connections is essential due to potential end product failure. As both module size and distance from which solder connections are located to the center of the module (i.e., the distance from neutral point, hereafter DNP) continue to increase, even CGA solder connections can become unreliable, especially due to thermal fatigue. These same concerns about broken interconnections also apply to PGA applications when the DNP is too large. Therefore, what is needed is an interconnection, which is relatively flexible and capable of accommodating the thermal mismatch over an expected temperature range that can closely match the electrical performance and density of a BGA or CGA array.

One solution is to use an LGA connector. An array of interconnection elements, known as an interposer, is placed between two arrays to be connected, and provides the electrical connection between the contact pins or pads. Since the individual contact members of an interposer can be made resilient, they can accommodate a CTE (coefficient of thermal expansion) mismatch between the module and system board.

An LGA package is an integrated circuit package having a plurality of the integrated circuit and a printed circuit board. An LGA can be mounted to a printed circuit board with connectors, which have been developed to maintain a solderless connection between an integrated circuit package and a printed circuit board. As the number of lands is increased, the pitch between contacts decreases and manufacturing problems consequently increase.

For example, the manufacturing method of placing individual wires into tightly packed through-holes requires tremendous technological developments. Another example is a metallized polymer interconnect (MPI) connector. The MPI connector includes a siloxane core with conductive fillers that is positioned between the LGA module and the substrate. However, extreme stress relaxation rates are needed in order to achieve a desired level of durability.

SUMMARY

It is therefore an objective of the present invention to provide a flexible LGA connector, so as to provide reliable electrical connection and enhance its durability.

In accordance with the foregoing and other objectives of the present invention, an LGA connector is used to interconnect an LGA package and a printed circuit board. The LGA connector includes an elastomeric body with a plurality of through-holes. Tubular metallic film conductors are formed on inner walls of the through-holes and splay out around the mouths of their upper and lower openings. The metal films are formed by vacuum metallization, sputtering, chemical plating, electrical plating or PVD (physical vapor deposition). The through-holes have a funnel-like shape to absorb external stresses on the surfaces of the deformable elastomeric body by redirecting the stress, to shrink the diameters of the through-holes. Moreover, the metal films' elastic deformation is larger than conventional metal conductive fillers so as to improve reliability.

According to another preferred embodiment, a triple-layered elastomeric body is provided when corresponding contact electrodes of an LGA package and a printed circuit board are mismatched in position. An upper elastomeric layer and a lower elastomeric layer made of rubber exist, which have a plurality of funnel-like through-holes formed by etching. A metal layer is formed on an inner wall and around each upper and lower opening of each through-hole of each layer. An interconnection elastomeric layer made of rubber exists, which has a plurality of funnel-like through-holes formed by etching. A metal layer is formed on an inner wall and around each upper and lower opening of each through-hole so as to interconnect the metal layer of the upper and lower elastomeric layer. Thus, the LGA connector in this preferred embodiment can interconnect an LGA package and a printed circuit board even when corresponding contact electrodes are mismatched in position.

It is to be understood that both the foregoing general description and the following detailed description are by examples and are intended to provide further explanation of the invention as claimed.

BRIEF DESCRIPTION OF THE DRAWINGS

The accompanying drawings are included to provide a further understanding of the invention and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1A:
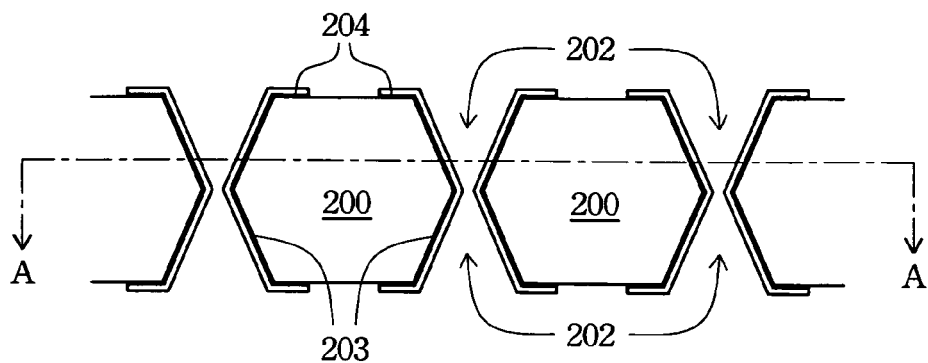
FIG. 1A illustrates a cross-sectional view of an LGA connector according to one preferred embodiment of this invention.

Reference will now be made in detail to the present preferred embodiments of the invention, examples of which are illustrated in the accompanying drawings. Wherever possible, the same reference numbers are used in the drawings and the description to refer to the same or like parts.

In order to overcome the shortcomings of the prior art, the present invention provides an LGA connector for solderless connection between an LGA package and a printed circuit board. The LGA connector is an elastomeric body having a plurality of through-holes. There is a metal layer on an inner wall and around each upper and lower opening of each through-hole so as to interconnect an LGA package and a printed circuit board.

FIG. 1A illustrates a cross-sectional view of an LGA connector according to one preferred embodiment of this invention. The LGA connector includes an elastomeric body 200 made of rubber, which has a plurality of funnel-like through-holes 202 formed by etching. A metal layer 204 is formed on an inner wall and around each upper and lower opening of each through-hole 202. Each metal layer 204 is insulated from one another. A polyurethane layer 203 is formed by coating between the metal layer 204 and the inner wall of each through-hole 202 so as to maintain the as-deposited physical and chemical properties of the metal layers. The manufacturing method for coating the metal layer 204 can be vacuum metallization, chemical plating, electrical plating, physical vapor deposition or sputtering.

Figure 1B:
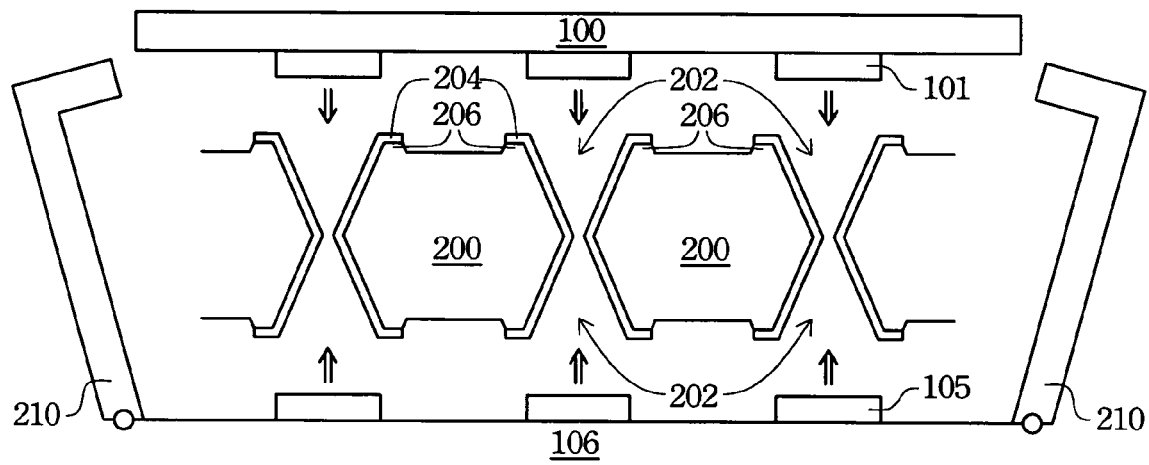
FIG. 1B illustrates a cross-sectional view of an LGA connector according to another preferred embodiment of this invention.

FIG. 1B illustrates a cross-sectional view of an LGA connector according to another preferred embodiment of this invention. The LGA connector includes an elastomeric body 200 made of rubber, which has a plurality of funnel-like through holes 202 formed by etching. A metal layer 204 is formed on an inner wall and around each upper and lower opening of each through-hole 202. Each metal layer 204 is insulated from one another. A bump 206 of elastomeric material is formed around each through-hole 202 so as to increase contact effect. In practice, a clamp 210 should be designed on a printed circuit board 106 so as to secure an LGA package 100 and the LGA connector together. The manufacturing method for coating the metal layer 204 can be vacuum metallization, chemical plating, electrical plating, physical vapor deposition or sputtering. This LGA connector could be employed to interconnect two printed circuit boards with LGA-type electrodes as well.

Figure 2:
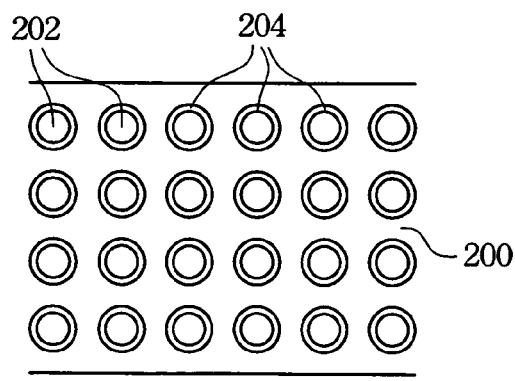
FIG. 2 illustrates a top cross-sectional view of an LGA connector's elastomeric body according to one preferred embodiment of this invention.

FIG. 2 illustrates a top cross-sectional view of an LGA connector's elastomeric body according to one preferred embodiment of this invention. FIG. 2 is taken along the line A—A in FIG. 1A and illustrates an elastomeric body 200 made of rubber, which has a plurality of through-holes 202 coated by metal layers 204.

Figure 3:
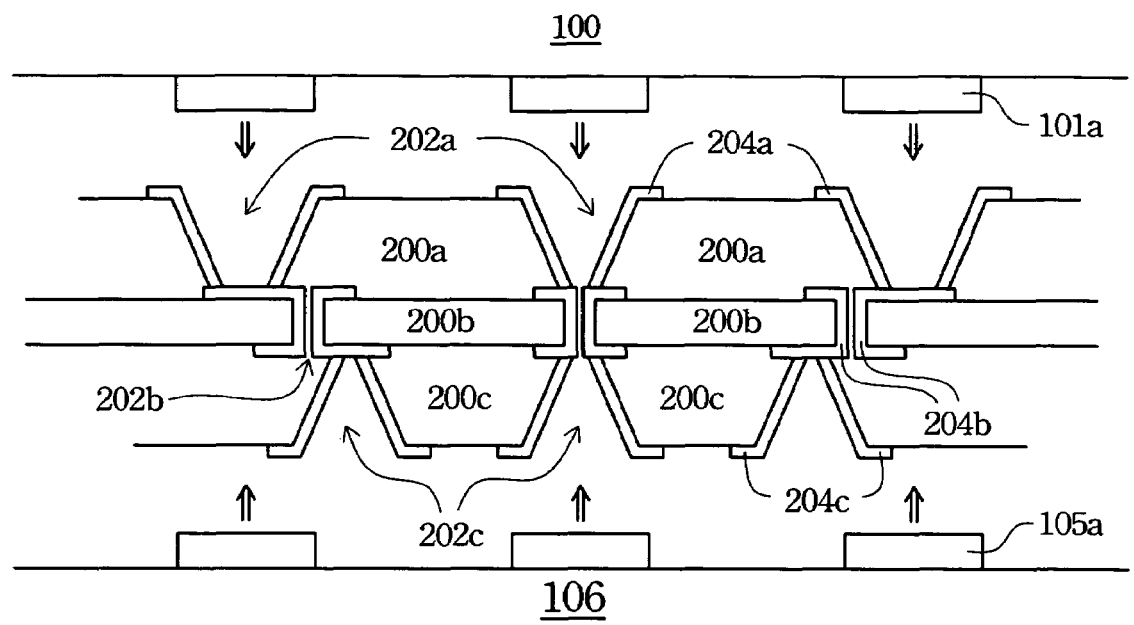
FIG. 3 illustrates a cross-sectional view of an LGA connector according to yet another preferred embodiment of this invention.

FIG. 3 illustrates a cross-sectional view of an LGA connector according to yet another preferred embodiment of this invention. When corresponding contact electrodes 101a and 105a mismatch in position (i.e., a contact electrode 101a mismatches its corresponding contact electrode 105a such that they cannot be connected by the LGA connector illustrated in FIGS. 1A and 1B), this preferred embodiment discloses a triple-layered elastomeric body to resolve this issue. An upper elastomeric layer 200a made of rubber exists, which has a plurality of funnel-like through-holes 202a formed by etching. A metal layer 204a is formed on an inner wall and around each upper and lower opening of each through-hole 202a. Each metal layer 204a is insulated from one another. A lower elastomeric layer 200c made of rubber exists, which has a plurality of funnel-like through-holes 202c formed by etching. A metal layer 204c is formed on an inner wall and around each upper and lower opening of each through-hole 202c. An interconnection elastomeric layer 200b made of rubber exists, which has a plurality of through-holes 202b formed by etching. A metal layer 204b is formed on an inner wall and around each upper and lower opening of each through-hole 202b so as to interconnect the metal layer 204a and 204c. Thus, the LGA connector in this preferred embodiment could interconnect an LGA package and a printed circuit board even when corresponding contact electrodes are mismatched in position. This LGA connector could be employed to interconnect two printed circuit boards with LGA-type electrodes as well.

Figure 4:
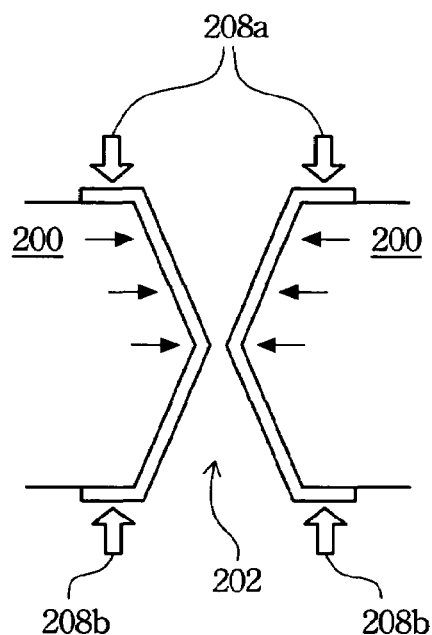
FIG. 4 illustrates a cross-sectional view of an LGA connector under upper and lower stress according to one preferred embodiment of this invention.

FIG. 4 illustrates a cross-sectional view of an LGA connector under upper and lower stress according to one preferred embodiment of this invention. The LGA connector equipped with an elastomeric body 200 and funnel-like through-holes 202 can accommodate the thermal mismatch and achieve a desired level of durability. When the through-holes have a funnel-like design, pressure, under upper stress 208a and lower stress 208b, can be absorbed by redirecting the stress to shrink the through-hole diameters. Moreover, metal layers are more flexible than metal fillers, such that the electrical connection is more reliable.

According to the preferred embodiments above, the disclosed LGA connector equipped with an elastomeric body and funnel-like through-holes can provide a reliable electrical connection. When the through-holes have a funnel-like design, pressure from above and below can be absorbed by shrinking the through-hole diameters. Moreover, metal layers are more flexible than metal fillers, such that the electrical connection is more reliable.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. An LGA connector for interconnection between an LGA packaged integrated circuit and a printed circuit board, said LGA connector comprising:
    an elastomeric body, having an upper major surface, and a lower major surface opposed to said upper major surface;
    a plurality of tubular metallic film conductors, each connecting an upper opening on said upper major surface to an opposed lower opening on said lower major surface, each of said plurality of tubular metallic film conductors being formed by metallic deposition around said upper opening and said opposed lower opening and onto a surface of an inner wall of a through-hole connecting said upper opening and said opposed lower opening, each of said plurality of tubular metallic film conductors being insulated from one another; and
    each of said plurality of tubular metallic film conductors having an axial cross-section which tapers inwardly from said upper opening to form a funnel-like shape with a central through-hole; and
    wherein each of said plurality of tubular metallic film conductors compress radially inward in reaction to external stresses exerted against said upper major surface and said lower major surface;
    whereby a portion around said upper opening of each of said plurality of metallic film conductors connects to the LGA packaged integrated circuit, and a portion around said opposed lower opening of each of said plurality of metallic film conductors connects to the printed circuit board.

2. The LGA connector of claim 1, wherein said plurality of tubular metallic film conductors are formed by vacuum metallization, chemical plating, physical vapor deposition, or sputtering.

3. An LGA connector for interconnection between an LGA packaged integrated circuit and a printed circuit board, said LGA connector comprising:

an elastomeric body, having an upper major surface, and a lower major surface opposed to said upper major surface;

a plurality of tubular metallic film conductors, each connecting an upper opening on said upper major surface to an opposed lower opening on said lower major surface, each of said plurality of tubular metallic film conductors being formed by metallic deposition around said upper opening and said opposed lower opening and onto a surface of an inner wall of a through-hole connecting said upper opening and said opposed lower opening, and each of said plurality of tubular metallic film conductors being insulated from one another; and a polyurethane layer interposed between each of said plurality of metallic film conductors and the corresponding surface of said elastomeric body;

each of said plurality of tubular metallic film conductors having an axial cross-section which tapers inwardly from said upper opening and said opposed lower opening to form a funnel-like shape with a central through-hole; and wherein each of said plurality of tubular metallic film conductors compress radially inward in reaction to external stresses exerted against said upper major surface and said lower major surface;

whereby a portion around said upper opening of each of said plurality of metallic film conductors connects to the LGA packaged integrated circuit, and a portion around said opposed lower opening of each of said plurality of metallic film conductors connects to the printed circuit board.

4. The LGA connector of claim 3, wherein said plurality of tubular metallic film conductors are formed by vacuum metallization, chemical plating, physical vapor deposition, or sputtering.

* * * * *